(12) United States Patent
Yamazaki et al.

(10) Patent No.: US 6,919,533 B2
(45) Date of Patent: Jul. 19, 2005

(54) METHOD FOR MANUFACTURING A DISPLAY DEVICE INCLUDING IRRADIATING OVERLAPPING REGIONS

(75) Inventors: Shunpei Yamazaki, Tokyo (JP); Koichiro Tanaka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/868,223

(22) Filed: Jun. 16, 2004

(65) Prior Publication Data

US 2004/0232116 A1 Nov. 25, 2004

Related U.S. Application Data

(63) Continuation of application No. 10/341,661, filed on Jan. 13, 2003, which is a continuation of application No. 09/615,261, filed on Jul. 13, 2000, now Pat. No. 6,534,744, which is a continuation of application No. 09/211,719, filed on Dec. 14, 1998, now Pat. No. 6,156,997, which is a continuation of application No. 08/650,285, filed on May 20, 1996, now Pat. No. 5,893,990.

(30) Foreign Application Priority Data

May 31, 1995 (JP) ............................................. 7-158645

(51) Int. Cl.$^7$ ............................................. B23K 26/00
(52) U.S. Cl. .................................... 219/121.8; 438/487
(58) Field of Search ...................... 219/121.8; 438/487, 438/795, 799; 148/565

(56) References Cited

U.S. PATENT DOCUMENTS

| | | | |
|---|---|---|---|
| 4,304,978 A | 12/1981 | Saunders | |
| 4,309,225 A | 1/1982 | Fan et al. | |
| 4,330,363 A | 5/1982 | Biegesen et al. | |
| 4,591,231 A | 5/1986 | Kaiser et al. | |

(Continued)

FOREIGN PATENT DOCUMENTS

| | | |
|---|---|---|
| JP | 56-74925 | 6/1981 |
| JP | 58127318 | 7/1983 |
| JP | 60-257511 | 12/1985 |
| JP | 62-216318 | 9/1987 |
| JP | 64-076715 | 3/1989 |
| JP | 64-082517 | 3/1989 |
| JP | 01-260812 | 10/1989 |
| JP | 02-042717 | 2/1990 |
| JP | 02-177422 | 7/1990 |

(Continued)

OTHER PUBLICATIONS

Office Action (Application No. 2000–399963) with partial translation; Jan. 25, 2005, 6 pages.

Office Action (Application No. 2001–008132) with partial translation; Jan. 25, 2005, 8 pages.

Primary Examiner—Geoffrey S. Evans
(74) Attorney, Agent, or Firm—Fish & Richardson P.C.

(57) ABSTRACT

A display device is manufactured by forming a semiconductor film over a substrate and irradiating the film with laser light. The laser light is generated from an oscillator, passes through an attenuator that includes a filter, and passes through an optical system after passing through the attenuator. A first region of the semiconductor film is irradiated with the laser light passed through the optical system such that one point of the first region of the semiconductor film is irradiated with at least two shots. A second region of the semiconductor film is also irradiated with the laser light passed through the optical system such that one point of the second region of the semiconductor film is irradiated with at least two shots. The first region and the second region have a portion at which they overlap, and the semiconductor film is etched into semiconductor layers for transistors in areas outside the portion.

30 Claims, 11 Drawing Sheets

U.S. PATENT DOCUMENTS

| | | |
|---|---|---|
| 4,775,220 A | 10/1988 | Penkethman |
| 4,778,263 A | 10/1988 | Foltyn |
| 4,906,071 A | 3/1990 | Takahara et al. |
| 5,145,808 A | 9/1992 | Sameshima et al. |
| 5,204,773 A | 4/1993 | Guida |
| 5,313,076 A | 5/1994 | Yamazaki et al. |
| 5,357,365 A | 10/1994 | Ipposhi et al. |
| 5,365,875 A | 11/1994 | Asai et al. |
| 5,382,548 A | 1/1995 | Lee |
| 5,413,958 A | 5/1995 | Imahashi et al. |
| 5,432,122 A | 7/1995 | Chae |
| 5,529,951 A | 6/1996 | Noguchi et al. |
| 5,561,081 A * | 10/1996 | Takenouchi et al. ........ 438/166 |
| 5,578,520 A | 11/1996 | Zhang et al. |
| 5,589,406 A | 12/1996 | Kato et al. |
| 5,643,826 A | 7/1997 | Ohtani et al. |
| 5,712,191 A | 1/1998 | Nakajima et al. |
| 5,766,344 A | 6/1998 | Zhang et al. |
| 5,789,763 A | 8/1998 | Kato et al. |
| 5,893,990 A | 4/1999 | Tanaka |
| 5,897,799 A | 4/1999 | Yamazaki et al. |
| 5,953,597 A | 9/1999 | Kusumoto et al. |
| 6,002,101 A | 12/1999 | Yamazaki et al. |
| 6,008,144 A * | 12/1999 | Shih et al. .................. 438/795 |
| 6,051,453 A | 4/2000 | Takemura |
| 6,096,581 A | 8/2000 | Zhang et al. |
| 6,156,997 A | 12/2000 | Yamazaki et al. |
| 6,157,066 A | 12/2000 | Kobayashi |
| 6,174,757 B1 * | 1/2001 | Yamaguchi et al. ........ 438/166 |
| 6,198,133 B1 | 3/2001 | Yamazaki et al. |
| 6,242,292 B1 | 6/2001 | Yamazaki et al. |
| 6,300,176 B1 | 10/2001 | Zhang et al. |
| 6,310,362 B1 | 10/2001 | Takemura |
| 6,358,784 B1 | 3/2002 | Zhang et al. |
| 6,534,744 B1 | 3/2003 | Yamazaki et al. |
| 6,534,832 B2 | 3/2003 | Takemura |
| 2002/0033483 A1 | 3/2002 | Takemura |
| 2003/0218215 A1 | 11/2003 | Takemura |

FOREIGN PATENT DOCUMENTS

| | | |
|---|---|---|
| JP | 03-286518 | 12/1991 |
| JP | 04-053128 | 2/1992 |
| JP | 04-102311 | 4/1992 |
| JP | 04-307727 | 10/1992 |
| JP | 05-034723 | 2/1993 |
| JP | 05-160151 | 6/1993 |
| JP | 05-198507 | 8/1993 |
| JP | 06-077131 | 3/1994 |
| JP | 06-089905 | 3/1994 |
| JP | 06-124913 | 5/1994 |
| JP | 07-092501 | 4/1995 |
| JP | 07-106599 | 4/1995 |
| JP | 07-131034 | 5/1995 |
| JP | 07-135174 | 5/1995 |
| JP | 09-050961 | 2/1997 |

* cited by examiner

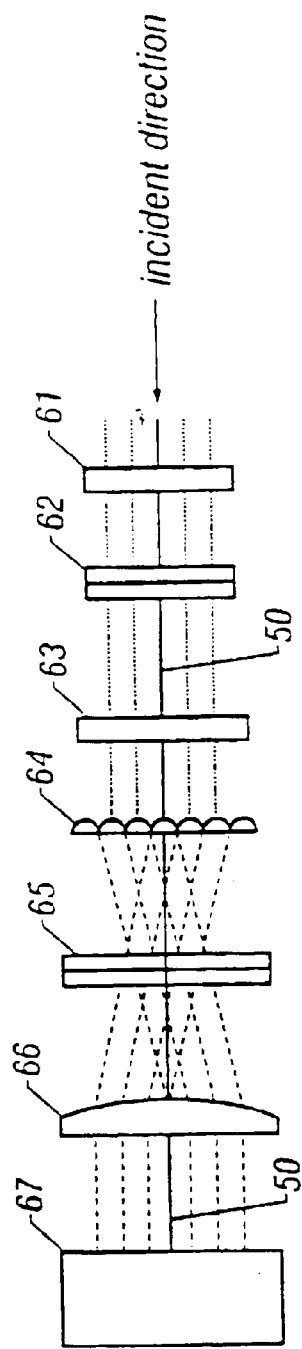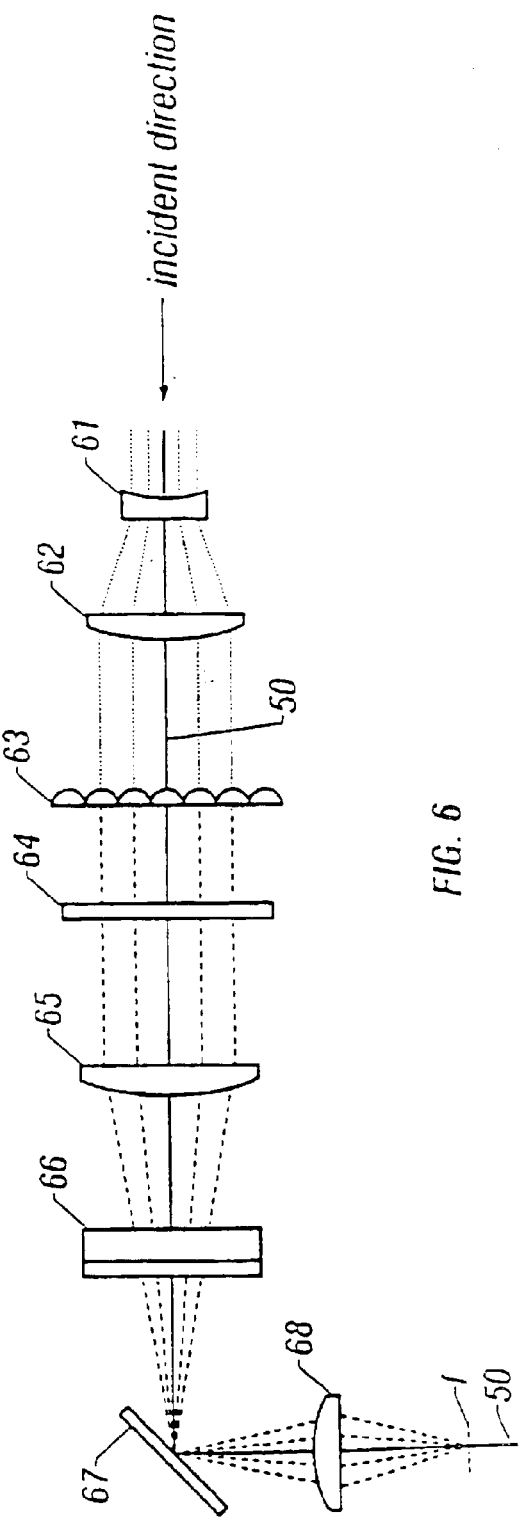
FIG. 5
FIG. 6

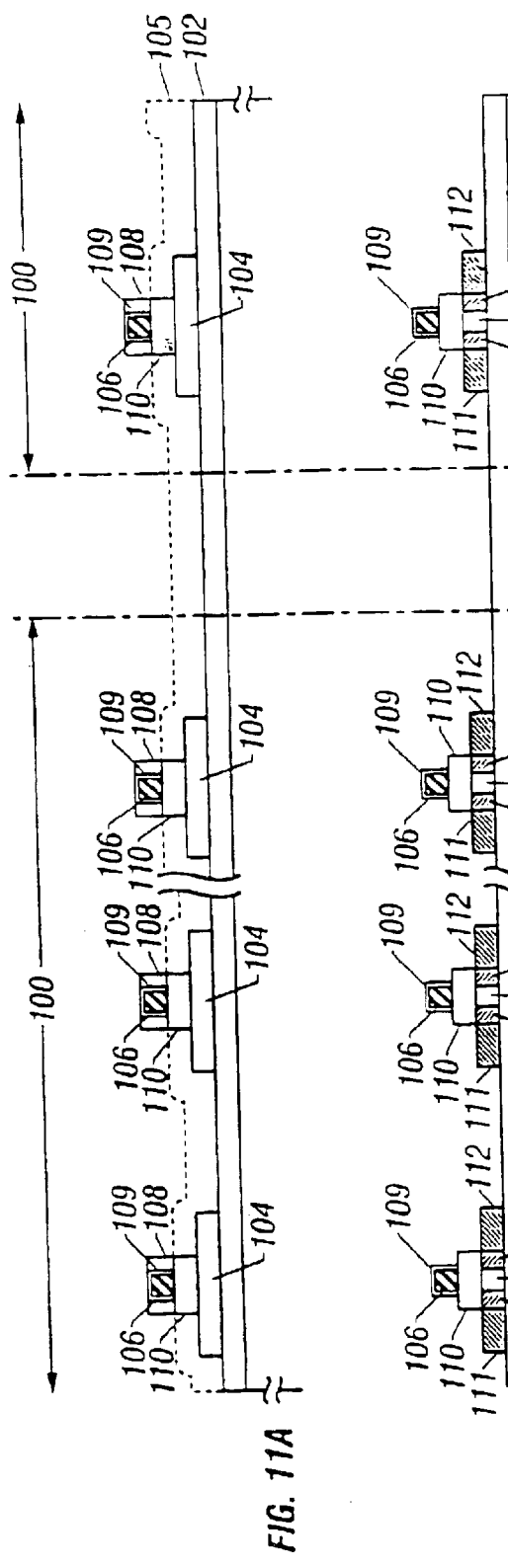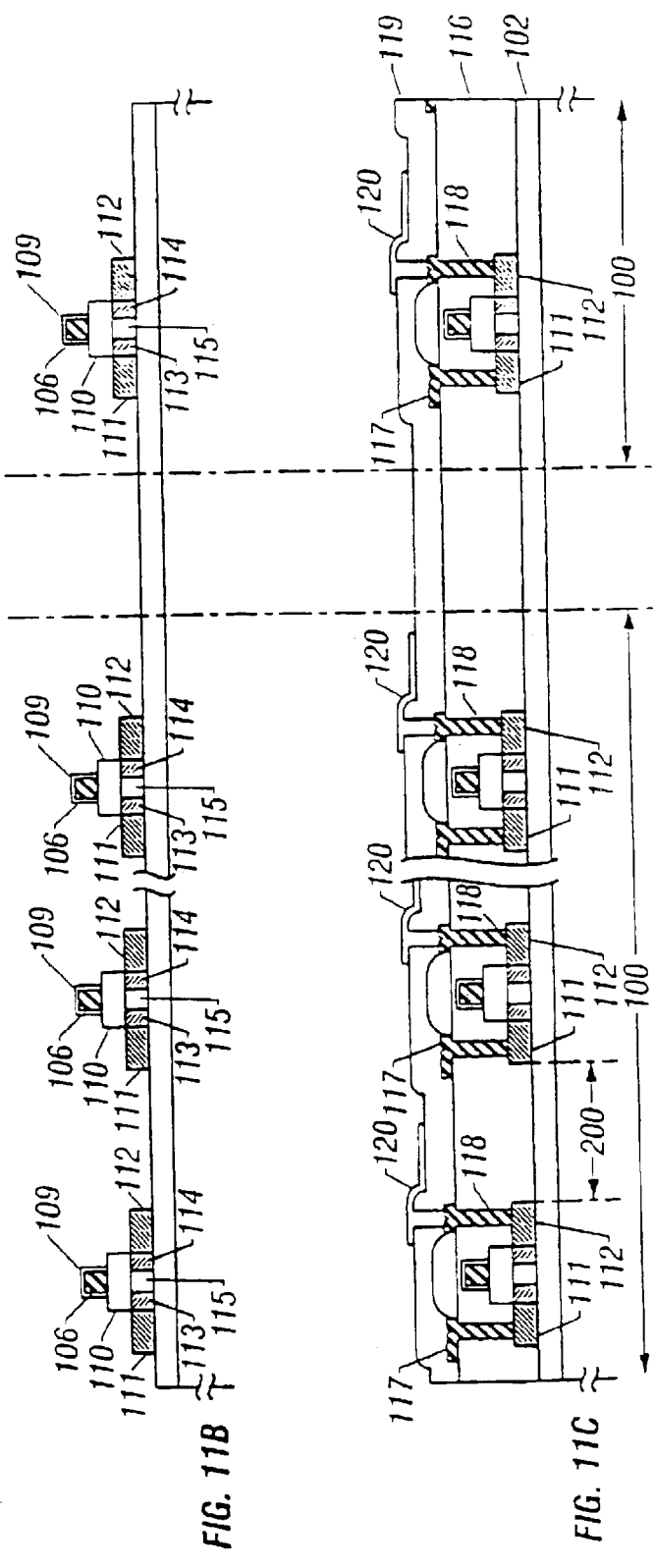
FIG. 11A
FIG. 11B
FIG. 11C

METHOD FOR MANUFACTURING A DISPLAY DEVICE INCLUDING IRRADIATING OVERLAPPING REGIONS

CROSS-REFERENCE TO RELATED APPLICATIONS

This application is a continuation application of U.S. application Ser. No. 10/341,661, filed Jan. 13, 2003, now allowed, which is a continuation of U.S. Ser. No. 09/615,261, filed Jul. 13, 2000, now U.S. Pat. No. 6,534,744, which is a continuation of U.S. Ser. No. 09/211,719, filed Dec. 14, 1998, now U.S. Pat. No. 6,156,997, which is a continuation of U.S. Ser. No. 08/650,285, filed May 20, 1996, now U.S. Pat. No. 5,893,990, which claims the benefit of a foreign priority application filed in Japan as Serial No. 07-158645 on May 31, 1995. This application claims priority to all of these applications, and all of these applications are incorporated by reference.

BACKGROUND OF THE INVENTION

The present invention relates to a laser processing method and a laser processing apparatus, and particularly, to an improvement of a throughput in an optical annealing stem with respect to the manufacture of an insulated gate type semiconductor device such as a thin-film transistor (TFT) which is formed on a substrate having a crystalline silicon film of non-single crystal and other semiconductor devices.

Particularly, the present invention relates to the manufacture of a semiconductor device which is formed on an insulating substrate made of glass or the like and having a large area.

Recently, studies have been made of an insulates gate type semiconductor device including a thin-film like active layer (also referred to as active region) on an insulating substrate. Particularly, studies have been made earnestly of thin-film like gate transistors, so-called thin-film transistors (TFT). These transistors are classified by the material and crystalline state of a used semiconductor into an amorphous silicon TFT, a crystalline silicon TFT, and the like. The crystalline silicon is not a single crystal but a non-single crystal. Accordingly, the general term for these transistors is a non-single crystal TFT.

In general, the mobility of an amorphous semiconductor is small, so that it can not be used as a TFT which is required high sped operation. Further, since the mobility of a P-type amorphous silicon is extremely small, thereby being unable to manufacture a P-channel TFT (TFT of PMOS) so that it is impossible to form a complementary MOS circuit (CMOS) by combining the P-channel TFT with an N-channel TFT (TFT of NMOS)

On the other hand, the crystalline semiconductor has a mobility larger than that of the amorphous semiconductor, so that high speed operation can be achieved. By the crystalline silicon, not only TFT of NMOS but also TFT of PMOS can be obtained, so that it is possible to form a CMOS circuit.

The crystalline silicon film of non-single crystal has been obtained by thermally annealing an amorphous silicon film obtained by a vapor phase deposition method for a long time at an appropriate temperature (normally more than 600° C.) or by irradiating it with the intense light such as a laser beam (optical annealing).

However, in the case where a glass substrate which is cheap and rich in workability, is used as an insulating substrate, it has been extremely difficult to obtain the crystalline silicon having a sufficiently high mobility (so high that a CMOS circuit can be formed) by only the thermal annealing. This is because the above-mentioned glass substrate has generally a low distortion point temperature (about 600° C.), so that it is impossible to increase the substrate temperature up to a temperature required to form the crystalline silicon film having the sufficiently high mobility.

On the other hand, in the case where the optical annealing is used to crystallize a silicon film base on a glass substrate, it is possible to give a high energy to only the silicon film without increasing the substrate temperature to a very high temperature. Thus, the optical annealing technique is regarded as very effective for crystallizing the silicon film based on the glass substrate.

At present, a high power pulse laser such as an excimer laser is most preferable as an optical source for the optical annealing. The maximum energy of this laser is very large as compared with a continuous-wave laser such as an argon ion laser, so that it has been possible to improve the throughput by using a large spot of more than several $cm^2$. However, when a normally used square or rectangular beam is used, it must be moved up and down and right and left to process one substrate having a large area. Thus, there is a room for improvement from the viewpoint of the throughput.

Concerning this, much improvement has been obtained by transforming a beam into a liner beam to extend the length of the beam (largeness of the cross section of the linear beam in the longitudinal direction) over a substrate to be processed, and by moving this beam relatively to the substrate to scan. Here, the scanning means that irradiation of the laser beam is performed while the linear laser beam is moved in the line width direction (direction orthogonal to the longitudinal direction of the cross section of the linear beam), and the irradiated regions are overlapped with each other not to separate the irradiated regions. Also, in general, when the irradiation of the linear laser beam is performed for a large area, the scanning paths are made parallel to each other.

Further, before the optical annealing, when the thermal annealing is carried out, it is possible to form a silicon film having more superior crystallinity. With respect to the method of the thermal annealing, as disclosed in Japanese Patent Unexamined Publication No. Hei 6-244104, by using the effect that an element such as nickel, iron, cobalt, platinum, or palladium (hereinafter referred to as crystallization catalytic element or simply referred to as catalytic element) accelerates the crystallization of amorphous silicon, the crystalline silicon film can be obtained by the thermal annealing at a lower temperature for a shorter time than a normal case.

However, in the above irradiation of the linear laser, in relation to the maximum energy thereof, the length of Ore linear laser beam (largeness of the cross section of the laser beam in the longitudinal direction) has been limited to about 20 cm at best.

If the processing is performed by the linear laser beam having a length longer than the limit, the energy density of the laser beam becomes insufficient to, for example, crystallize the amorphous silicon film. Thus, when a substrate having a large area is used and laser processing is performed for a region longer than the length of a linear laser beam, it has been necessary to perform scanning of the laser beam up and down and left and right, that is, both in the line width direction and in the longitudinal direction. FIG. 13(B) schematically shows scanning paths of a conventional laser beam.

FIG. 13(A) is a sectional view of a linear laser beam, and FIG. 13(B) is a view showing a surface to be irradiated viewed from the above. As shown in FIG. 13(A), an end portion 1a of a linear laser beam 1 is not completely rectangular, and the energy density in this portion is dispersed.

As shown in FIG. 13(B), the scanning of the hear laser beam 1 is performed along two scanning paths 2 and 3. For example, after the downward scanning of the linear laser beam 1 is performed along the left scanning pat, 2, the downward scanning is performed along the right scanning path 3. At this time, it is necessary to perform scanning so that the end portions 1a of the linear laser beams 1 are overlapped with each other. Then, it becomes a problem how to overlap the end portions 1a of the linear laser beams 1. In FIG. 13(B), a region 4 shown in a rectangle is a region where scanning is performed by the overlapped end portions 1a of the linear laser beams 1 in the surface to be irradiated.

However, in general, since it is difficult to control the energy density at the end portion 1a of the linear laser beam 1, semiconductor devices formed in the region 4 and in the neighborhood thereof are of extremely uneven characteristics as compared with devices formed in other region. Thus, the semiconductor material in the region 4 is not suitable for processing of semiconductor devices.

As a countermeasure to the above problem, by irradiation of a laser beam through a slit, the end portion in the longitudinal direction in which the control of energy density is difficult, is shielded to shape the end portion of the laser beam. FIG. 14(A) is a sectional vied showing a linear laser beam shaped by the slit, and FIG. 14(B) is a schematic view showing scanning paths of the laser beam and is a view showing a surface to be irradiated viewed from the above.

As shown in FIG. 14(A) though the slit, an end portion 5a of a laser beam 5 is shaped into a rectangle, so that the distribution of the energy density in the end portion 5a becomes uniform than the linear laser beam 1 shown in FIG. 13(A). As shown in FIG. 14(B), when the irradiation of the linear laser beam 5 is performed, for example, the following scanning steps may be made: after the downward scanning of the linear laser beam 5 is performed along a left scanning path 6, the downward scanning is performed along a right scanning path 7. At this time, the scanning is performed so that the end portions 5a of the linear laser beams 5 are overlapped with each other. However, since the end portion 5a of the laser beam 5 is shaped into a rectangle, and the energy density distribution is uniform, it is sufficient to overlap the end portions 5a of the linear laser beam 5 with each other to the extent that the end portions 5a are brought into contact with each other, as shown by reference numeral 8. Thus, it is possible to reduce the region 8 where the ends 5a are overlapped with each other.

However, even if the energy density in the end portion 5a of the laser beam 5 is controlled by using the slit, the semiconductor devices formed in the region 8 to be scanned with the overlapped end portions 5a of the laser beam 5, are of remarkably uneven characteristics as compared with devices formed in other region.

SUMMARY OF THE INVENTION

An object of the present invention is to provide a laser processing method and a laser precessing apparatus that can eliminate the above-described problems and can perform the steps of laser annealing for a semiconductor film having a large area with high throughput.

Another object of the present invention is to provide a laser processing method and a laser processing apparatus for a semiconductor film having a large area, which can prevent unevenness of characteristics among a plurality of semiconductor devices.

In order to solve the problems, according to a first aspect of the invention, a laser processing method is characterized in that when a semiconductor film, a width of which is longer than a length of the cross section of a laser beam, is scanned and irradiated with the laser beam having the linear cross section to perform annealing, a semiconductor device is not formed in a region irradiated with end portions of the laser beams in a longitudinal direction thereof which are overlapped with each other or brought into contact with each other.

According to a second aspect of the invention, a laser processing method is characterized by comprising the steps of: repeatedly scanning and irradiating a semiconductor film on a substrate with a laser beam having a linear cross section; wherein the semiconductor film on the substrate includes a plurality of device regions separated from one another; and wherein the semiconductor film is scanned with the laser beam in such a manner that a region irradiated with end portions of the laser beams in a longitudinal direction thereof, which are overlapped with each other, is positioned outside the device regions.

According to a third aspect of the invention, a laser processing method in which a semiconductor film on a substrate is scanned and irradiated with a laser beam having a linear cross section, a length of the cross section of the linear laser beam being shorter than a largeness of a device region of the semiconductor region, the method is characterized by comprising the steps of cutting an end portion of the linear laser beam, a longitudinal direction thereof by the irradiation of the linear laser beam to the semiconductor film through a slit; laser processing one portion of the device region through scanning of the linear laser beam to form a laser-processed portion; and laser processing a non-laser-processed portion in the device region with a new linear laser beam passing through the slit in such a manner that an end of the laser beam in a longitudinal direction thereof with which the laser-processed portion has been scanned, is brought into contact with an end of the new laser beam in a longitudinal direction thereof.

According to a fourth aspect of the invention, a laser processing method in which a semiconductor film on a substrate is scanned and irradiated with a laser beam having a linear cross section, a length of the cross section of the linear laser beam being shorter than a largeness of a device region of the semiconductor region, the method is characterized by comprising the steps of: laser processing one portion of the device region by scanning and irradiating the semiconductor film with the linear laser beam to form a laser-processed portion, an end portion of the linear laser: beam in a longitudinal direction thereof being cut through a slit; and laser processing a non-laser-processed portion in the device region with a new linear laser beam passing through the slit in such a manner that an end of the laser beam in a longitudinal direction thereof with which the laser-processed portion has been scanned, is overlapped with an end of the new laser beam in a longitudinal direction thereof by a range of 10 to 20 $\mu$m.

According to a fifth aspect of the invention, a laser processing method in which a semiconductor film on a substrate is scanned and irradiated with a laser beam having a linear cross section, a length of the cross section of the linear laser beam being shorter than a largeness of a device region of the semiconductor region, the method is characterized by comprising the steps of cutting an end portion of the linear laser beam in a longitudinal direction thereof by the irradiation of the linear laser beam to the semiconductor film through a slit; laser processing one portion of the device region through scanning of the linear laser beam to form a laser-processed portion; and laser processing a non-laser-processed portion in the device region with a new linear laser beam passing through the slit in such a manner that an end of the laser beam in a longitudinal direction thereof with which the laser-processed portion has been scanned, is brought into contact with an end of the new laser beam in a longitudinal direction thereof, wherein a semiconductor device is not provided in a subsequent step at a position where the end portions are brought into contact with each other.

According to a sixth aspect of the invention, a laser processing method in which a semiconductor film on a substrate is scanned and irradiated with a laser beam having a linear cross section, a length of the cross section of the linear laser beam being shorter than a largeness of a device region of the semiconductor region, the method is characterized by comprising: laser processing one portion of the device region by scanning and irradiating the semiconductor film with the linear laser beam to form a laser-processed portion, an end portion of the linear laser beam in a longitudinal direction thereof being cut through a slit; and laser processing a non-laser-processed portion in the device region with a new linear laser beam passing through the slit in such a manner that an end of the laser beam in a longitudinal direction thereof with which the laser-processed portion has been scanned, is overlapped with an end of the new laser beam in a longitudinal direction thereof by a range of 10 to 20 μm, wherein a semiconductor device is not provided in a subsequent step at a position where the end portions are overlapped with each other.

According to a seventh aspect of the invention, a laser processing method of any one of the first to sixth aspects is characterized in that the substrate constitutes a liquid crystal display.

According to the present invention, when a semiconductor film having a width longer than a cross section of a laser beam is scanned and irradiated with the linear laser beam to perform annealing, a semiconductor device is not formed in a region irradiated with end portions 1a, 5a of the laser beams 1, 5, as shown in FIG. 12, which are overlapped with each other.

In other words, laser irradiation is controlled in such a manner that a region irradiated with end portions of the laser beams in the longitudinal direction thereof which are overlapped with each other or brought into contact with each other, is not positioned on a device region of the semiconductor film (where a semiconductor device is provided).

According to this method, even if a substrate becomes large and a region to be irradiated becomes large, laser annealing can be performed with a high throughput, and variation of characteristics among semiconductor devices can be suppressed.

BRIEF DESCRIPTION OF THE DRAWINGS

FIG. 5 is a construction view showing a lens system;

FIG. 6 is a construction view of a lens system and is also a sectional view along a light path in FIG. 5;

FIGS. 11(A) to 11(C) are explanatory views showing forming steps of a TFT in a third embodiment;

DETAILED DESCRIPTION OF THE PREFERRED EMBODIMENTS

Preferred embodiments of the present invention will be described with reference to the accompanying drawings.

[First Embodiment]

Figure 1:
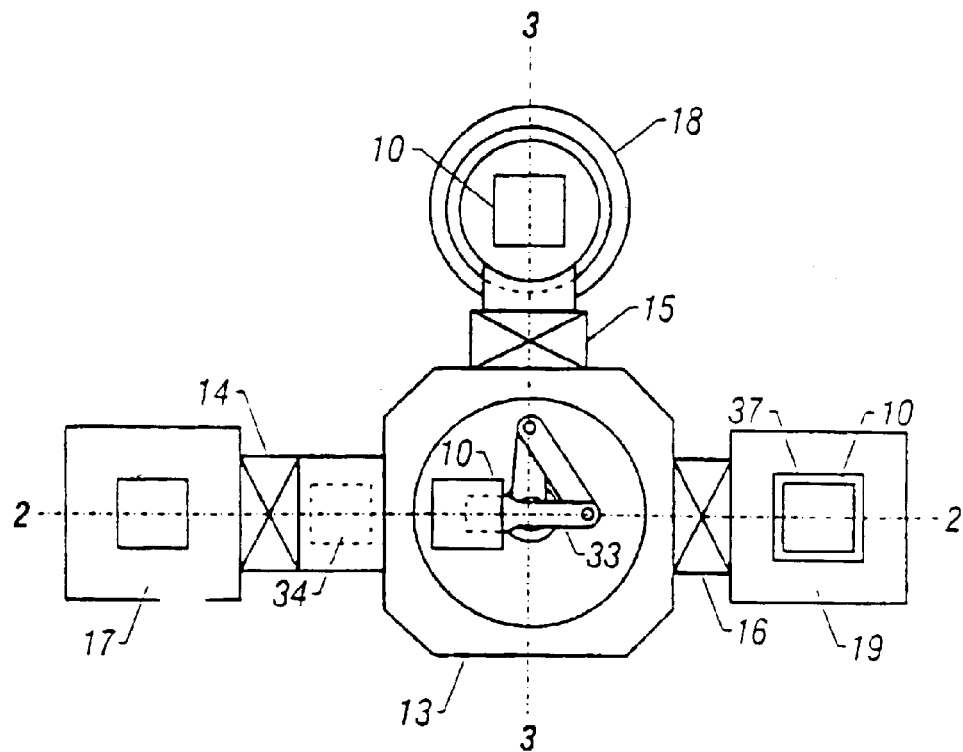
FIG. 1 is a construction view of a laser irradiation apparatus of a first embodiment and is also a top view.
Figure 2:
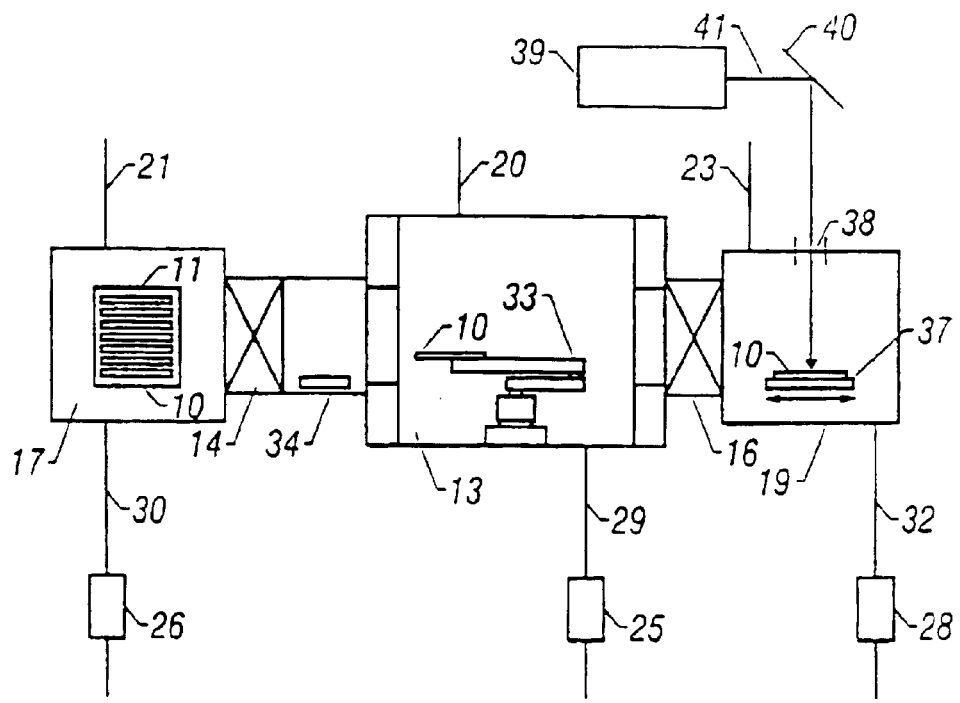
FIG. 2 is a sectional view taken along line A–A' in FIG. 1.
Figure 3:
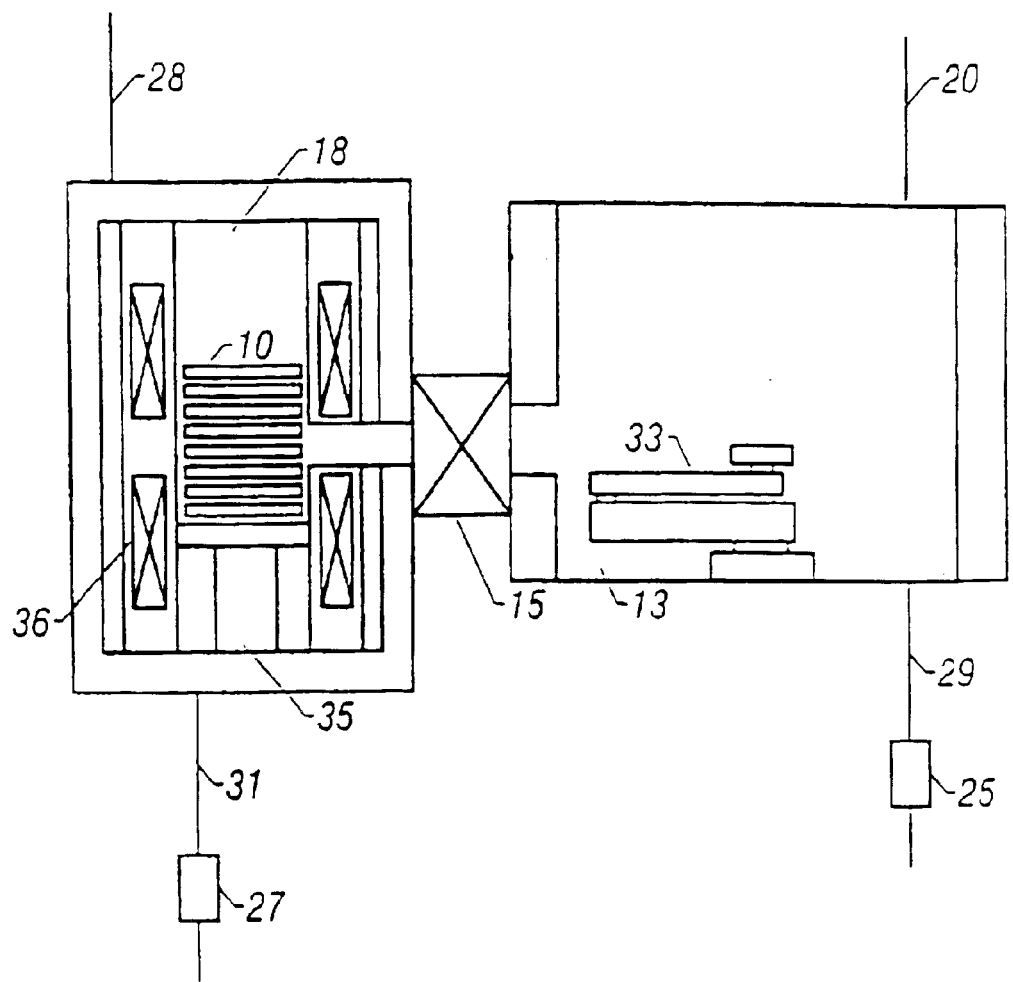
FIG. 3 is a sectional view taken along line B–B' in FIG. 1.

FIGS. 1 to 3 are construction views showing a laser irradiation apparatus of the first embodiment, in which FIG. 1 is a top view, FIG. 2 is a sectional view taken along dotted line A–A' in FIG. 1, and FIG. 3 is a sectional view taken along dotted line B–B' in FIG. 1. The laser irradiation apparatus of this embodiment is an apparatus of multi-chamber type, and also a single wafer processing apparatus that can process a plurality of substrates (test pieces) continuously one by one.

A plurality of substrates 10 to be processed are contained in a cartridge 11, and the substrates together with the cartridge 11 are carried into the apparatus.

A cartridge carry-in and carry-out chamber 17, a heating chamber 18, and a laser irradiation chamber 19 are respectively connected by gate valves 14 to 16 to a substrate transport chamber 13 for transporting the substrates 10 in the apparatus. The substrate transport chamber 13, the cartridge carry-in and carry-out chamber 17, the heating chamber 18, and the laser irradiation chamber 19 can be kept airtight, upper portions of which are respectively connected to gas supply systems 20 to 23 for supplying a gas, an inert gas and the like, and lower portions of which are respectively connected to exhaust systems 29 to 32 connected with vacuum pumps 25 to 28. By this structure, atmospheres, pressures and the like in the substrate transport chamber 13, the cartridge carry-in and carry-out chamber 17, the heating chamber 18, and the laser irradiation chamber 19 can be controlled.

A robot am 33 is provided in the substrate transport chamber 13, so that the substrates 10 can be transported into the cartridge carry-in and carry-out chamber 17, the heating chamber 18, or the laser irradiation chamber 19 one by one. Further, an alignment mechanism 34 is provided at the side of the gate valve, so that positioning of the substrate 10 and the robot arm 33 is carried out.

In the heating chamber 18, a plurality of substrates 10 can be contained on an elevator 35, and the substrates 10 are heated up to a predetermined temperature by heating means 36 formed of resistors and the like.

Further, in the laser irradiation chamber 19, a stage 37 on which the substrates 10 are set, is provided. The stare 37 includes heating means for heating the substrates 10, is freely and horizontally moved in the two-dimensional direction in the paper surface of FIG. 1 by a guide mechanism, motor and the like not shown, and is freely rotated around an axis orthogonal to the paper surface. Further, a quartz window 38 on which laser light emitted from the outside of the apparatus is made incident, is provided on the upper surface of the laser irradiation chamber 19.

As shown in FIG. 2, laser irradiation means 39 is provided in the outside of the apparatus, a mirror 40 is arranged on an optical path 41 of the laser light of the laser irradiating means 39 in the emitting direction, and the quartz window 38 of the laser irradiation chamber 19 is provided on the optical path 41 bent by the mirror 40. The laser light emitted from the laser irradiation means 39 is reflected by the mirror 40, passes through the quartz window 38, and is made incident on the substrate 10 arranged on the stage 37.

Figure 4:
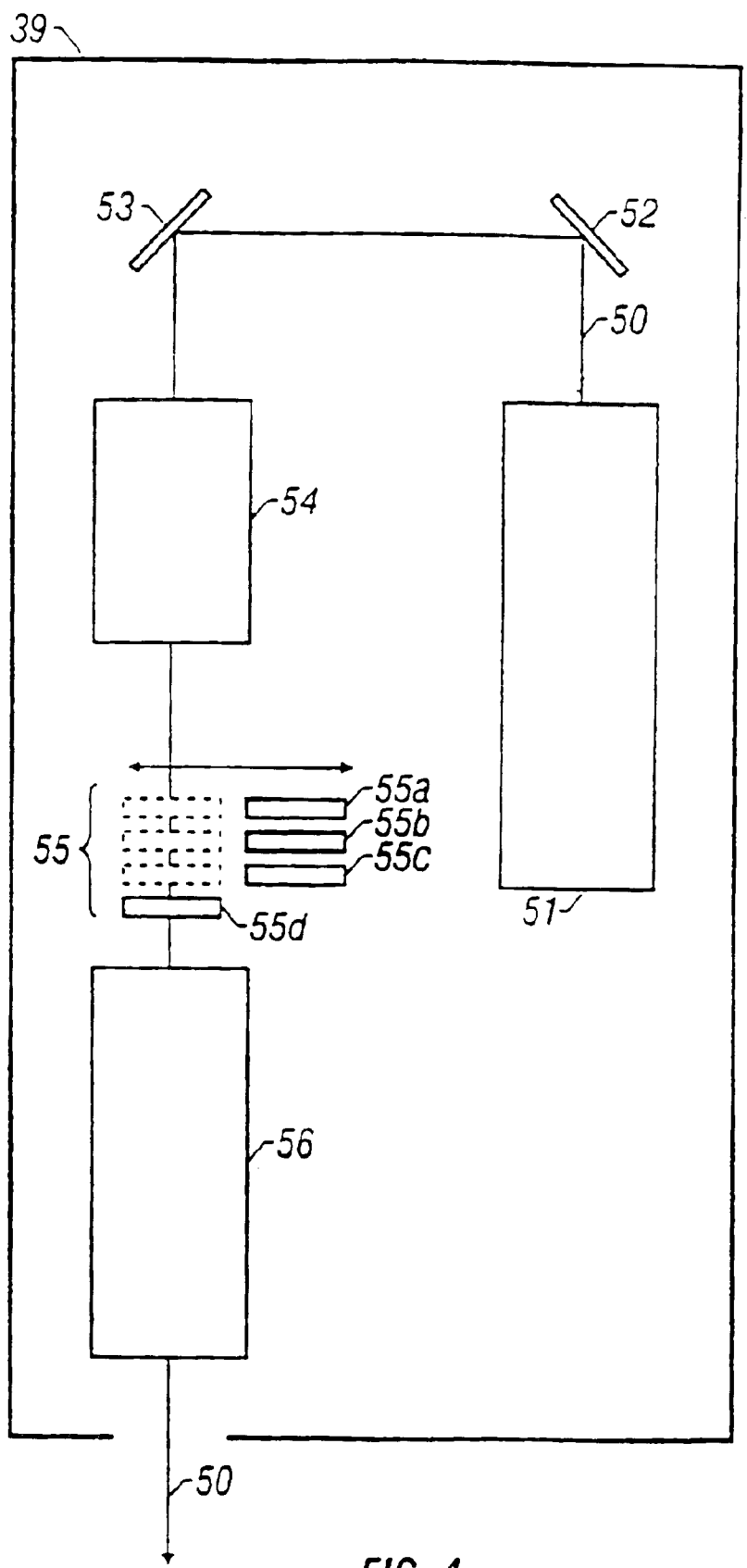
FIG. 4 is a construction view showing laser irradiating means 39.

FIG. 4 is a schematic construction view showing the laser irradiation means 39. Total reflection mirrors 52 and 53 are arranged on an optical path 50 of an oscillator 51, which generates the laser light, in the emitting direction thereof. On the optical path 50 in the reflection direction of the total reflection mirror 53, an amplifier 54, an attenuation meats 55 formed of a plurality of filters 55a to 55d, and an optical system 56 for shaping the laser light into a linear beam are sequentially arranged.

The attenuation means 55 is for adjusting the laser energy. The filters 55a to 55d have a function to attenuate the energy of transmitted light. Transmissivities of these filters are different from one another. In this embodiment, the transmissivities of the filters 55a to 55d are respectively 96%, 92%, 85%, and 77%. These filters 55a to 55d are independently taken into and out of the optical path 50 by driving means such as a, electromagnet or a motor not shown. By suitably combining the filters 55a to 55d, a filter with transmissivity of 57 to 96% can be formed. For example, by combining the filter 55a of transmissivity of 96% and the light reduction filter 55b of transmissivity of 92%, a light reduction filter of transmissivity of 88% can be obtained.

The filters 55a to 55d are made of quartz coated-with layers of hafnium oxide and silicon dioxide alternatively laminated. The transmissivity of the light reduction filters 55a to 55d depends on the number of coated layers. In this embodiment, although the number of the filters 55a to 55d of the attenuation means 55 is four, the invention is not limited to this number, but the number, transmissivity and the like of the filters may be determined so that the laser energy can be suitably adjusted.

FIGS. 5 and 6 are construction views showing the optical system 56, and FIG. 6 corresponds to a sectional view along the optical path 50 in FIG. 5. As shown in FIGS. 5 and 6, on the optical path 50, a cylindrical concave lens 61, a cylindrical convex lens 62, fly eye lenses 63 and 64 having axes orthogonal to each other, cylindrical convex lenses 65 and 66, and a total reflection mirror 67 are arranged sequentially from the incident direction. A cylindrical lens 68 is arranged on an optical path in the reflection direction of the total reflection mirror 67.

In the laser irradiation means 39 shown in FIG. 4, the laser light oscillated by the oscillator 51 is reflected by the total reflection mirrors 52 and 53, and made incident on the amplifier 54. In the amplifier 54, the laser light is amplified, reflected by the total reflection mirrors 52 and 53 respectively, passes through the attenuation means 55, and reaches the optical system 56. As shown in FIGS. 5 and 6, the laser light passes through the cylindrical concave lens 61, the cylindrical convex lens 62, and the fly eye lenses 63 and 64, so that the energy distribution of the laser light is changed from the Gaussian distribution type to the rectangular distribution type. Further, the laser light passes through the cylindrical convex lenses 65 and 66, reflected by the total reflection mirror 67, and collected by the cylindrical lens 68, so that a linear beam image is made on focal surface f. This linear beam image has its longitudinal direction vertical to the paper surface in FIG. 6.

The shape of the laser beam immediately before being made incident on the optical system 56 is a rectangle of 3×2 $cm^2$. However, after the laser beam passes through the optical system 56, the beam is shaped into a thin and long linear beam with a length of 10 to 30 cm and a width of about 0.1 to 1 cm.

In the case where laser annealing is performed by using the laser irradiation apparatus shown in FIGS. 1 to 3, the gate valves 14 to 16 are first closed, and the substrate transport chamber 13, the heating chamber 18, and the laser irradiation chamber 19 are filled with a nitrogen gas.

Next, the cartridge 11 containing a plurality of substrates 10 is carried in the cartridge carry-in and carry-out chamber 17 from the outside. In the cartridge carry-in and carry-out chamber 17, a door not shown is provided. By closing and opening this door, the cartridge 11 is carried in and carried out. After the cartridge 11 is carried in the cartridge carry-in and carry-out chamber 17, the door is closed to seal the cartridge carry-in and carry-out chamber 17, and the nitrogen gas is supplied from the gas supply system 21 to fill the cartridge carry-in and carry-cut chamber 17 with the nitrogen gas. The pressure in the cartridge carry-in and carry-out chamber 17 is not specifically reduced, but kept at an atmospheric pressure. Next, the gate valve 14 and the gate valve is are opened. The gate valve 14 may be kept open until a series of steps are ended.

By the robot arm 33, the substrates 10 are taken from the cartridge 11 set in the cartridge carry-in and carry-out chamber 17 one by one, and are mounted or the alignment mechanism 34. After the robot arm 33 and the substrate 10 are once positioned, the substrate 10 is again taken by the robot arm 33, and transported into the heating chamber 18. At each time when the substrates 10 are transported into the heating chamber 18, the elevator 35 rises or falls so that the substrates 10 are contained in the sequentially laminated state.

After a predetermined number of substrates 10 are transported into the heating chamber 18, the gate valve 15 is closed, and the substrates 10 are heated by the heating means 36. When the substrates 10 are heated to a predetermined temperature, the gate valve 15 is opened, the substrates 10 are transported to the substrate transport chamber 13 from the heating chamber 18 by the robot arm 33, set on the alignment mechanism 34, and again positioned.

After the gate valve 16 is opened, the substrate 10 on the alignment mechanism 34 is set on the stage 37 in the laser irradiation chamber 19 by the robot arm 33, then the gate valve 15 and the gate valve 16 are closed. It is preferable that the gate valve 15 is opened and closed at each time when, the transport of the substrate is performed. This is because it is preferable to prevent the atmosphere in the heating chamber 18 from exerting thermal affection to the mechanical structure such as the robot arm 33.

After the gate valve 16 is closed, the linear laser beam is emitted from the laser irradiation means 39, and the linear laser beam is made incident on the substrate 10 on the stage 37 through the mirror 40 and the quartz window 38. The linear laser beam is made incident on the substrate 10 along the predetermined scanning path by rotating and horizontally moving the stage 37. During the irradiation of the laser beam, the substrate 10 is heated to the same temperature as a temperature in the heating chamber 18 by the heating means provided in the stage 37, so that thermal variation is suppressed. When the irradiation of the laser beam is ended, the gate valve 16 is opened, and the substrate 10 is contained in the cartridge 11 in the cartridge carry-in and carry-out chamber 17 by the robot arm 33. In this way, the process for one substrate 10 is ended.

When the process for one substrate 10 is ended, the gate valve 15 is opened, the following substrate 10 is taken from the heating chamber 18 by the robot arm 33, transported into the laser radiation chamber 19, set on the stage 37, and irradiated with the laser beam. In this way, the substrates 10 contained in the heating chamber 18 are irradiated with the laser beam one by one. When all steps are ended, all substrates 10 to have been processed are contained in the cartridge 11 set in the cartridge carry-in and carry-out chamber 17. This cartridge 11 is taken from the cartridge chamber 17, and the process may proceed with a next step.

It is necessary that the heating temperature in the heating chamber 18 is made lower than a temperature at which the amorphous silicon film is crystallized. This is because time intervals in which the substrates 10 are in the heating chamber, are different from each other. In general, the heating temperature in the heating chamber 18 is selected to be about 200 to 400° C. Further, it is necessary that this heating temperature is made the same as a heating temperature of the substrate 10 at the irradiation of the laser light.

[Second Embodiment]

Figure 7A:
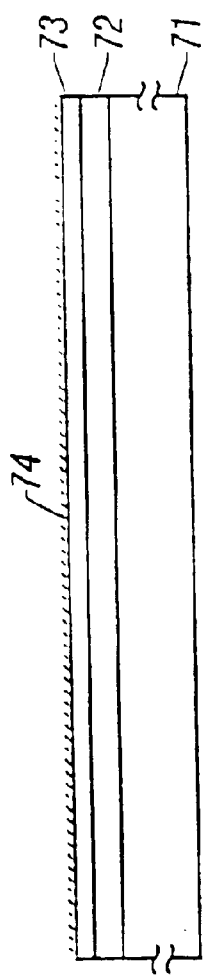
FIGS. 7(A) to 7(C) are explanatory views showing forming steps of a crystalline silicon film in a second embodiment.
Figure 7B:
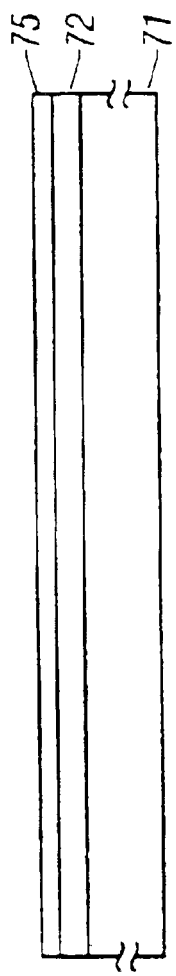
Figure 7C:
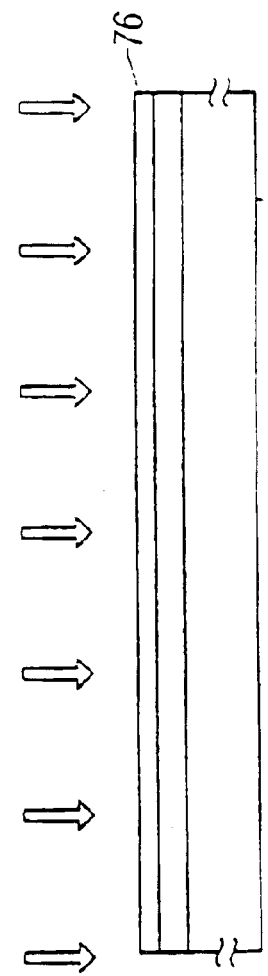

In this embodiment, there is shown a case where a substrate having a size exceeding a linear laser beam is used, and the crystalline silicon film for manufacturing a semiconductor device is formed. FIGS. 7(A) to 7(C) are views showing manufacturing steps of the crystalline silicon film.

As shown in FIG. 7(A), on a glass substrate 71 (in this embodiment, Corning 7059 of 360 mm×460 mm is used), a silicon oxide film as an under film 72 of a thickness of 2000 Å, and an amorphous silicon film 73 of a thickness of 500 Å are continuously formed by a plasma CVD method.

Then, a nickel acetate solution of 10 μm is coated on the surface of the amorphous silicon film 73 by a spin coat method, and the surface is dried to form a nickel layer 74. When a surface active agent was added into the nickel acetate solution, a better result was obtained. Since the nickel-layer 74 is very thin, it is not necessarily a film. However, there is no problem in the subsequent steps.

As shown in FIG. 7(B), the amorphous silicon film 73 is annealed at 550° C. for four hours to crystallize the amorphous silicon film, so that the crystalline silicon film 75 is obtained. By heating, the nickel in the nickel layer 74 functions as nuclei of crystal so that crystallization of the amorphous silicon film 73 is accelerated. Thus, the crystalline silicon film 75 can be obtained at a low temperature such as 550° C. (less than a distortion temperature of Corning 7059) and for a short time such as four hours.

It was preferable that the concentration of catalytic element in the crystalline silicon film 75 was $1\times10^{15}$ to $1\times10^{19}$ atom/cm$^3$. If the concentration is less than $1\times10^{15}$ atom/cm$^3$, it is difficult to obtain the catalytic effect to accelerate the crystallization. If the concentration is higher than $1\times10^{19}$ atom/cm$^3$, metallic characteristics appear in the silicon, so that semiconductive characteristics disappear. In this embodiment, the minimum value of the concentration of the catalytic element in the crystalline silicon film 75 was $1\times10^{17}$ to $5\times10^{18}$ atom/cm$^3$. These values were analyzed and measured by a secondary ion mass spectroscopy (SIMS).

In order to further improve the crystallinity of the thus obtained crystalline silicon film 75, as shown in FIG. 7(C), the film 75 is irradiated with an excimer laser of a large power pulse laser to form the crystalline silicon film 76 having superior crystalline properties.

When the irradiation of a laser beam is performed, using the apparatus as shown in FIGS. 1 to 6, a KrF excimer laser beam (wavelength 248 nm, pulse width 30 nsec) is shaped into a linear beam of 1 mm×185 mm, the irradiation of the laser beam with the energy density of about 220 mJ/cm$^2$ is first performed, and then the irradiation of the laser beam with the energy density within the range of 100 mJ/cm$^2$ to 500 mJ/cm$^2$, for example, with the energy density of 370 mJ/cm$^2$ is performed. Also when attention is paid to one point of a material to be irradiated, the scanning speed of the laser beam, actually the moving speed of the stage 37 on which the substrate 71 is set, is adjusted so that the irradiation of 2 to 20 shots of the laser beam is performed.

The change of the laser energy from 220 mJ/cm$^2$ to 370 mJ/cm$^2$ is carried out in such a manner that in the laser irradiation means 39 shown in FIG. 4, the filters 55a to 55d of the attenuation means 55 are selectively inserted into and retracted from the optical path 50 in the state in which the output of the oscillator 51 is kept constant. The substrate temperature at the laser irradiation is 200° C.

It is assumed that such an irradiating method with changed irradiation energies is referred to as multi-stage irradiation. In this embodiment, irradiation is performed twice, so that two-stage irradiation is performed. By the two-stage irradiation, the crystallinity of the crystalline silicon film 76 can be further improved than one-stage irradiation. In case of the one-stage irradiation, the irradiation of the laser beam with the energy density within the range of 100 mJ/cm$^2$ to 500 mJ/cm$^2$, for example, with the energy density of 370 mJ/cm$^2$ may be performed.

FIGS. 8(A) to 8(D) show scanning paths of the laser beam in this embodiment. As shown in FIGS. 8(A) to 8(D), or the surface of the substrate 80 to be irradiated, rectangular device-formation regions 81 on which thin-film transistors are formed, are arranged in the matrix of 2×2. Thus, on the glass substrate 71 shown in FIG. 7(C), semiconductor devices are formed by using only the crystalline silicon 76 in the device-formation region 81. The substrate 80 on which semiconductor devices are formed, are divided into four device-substrates 86A to 86D as shown in FIG. 9.

Figure 9:
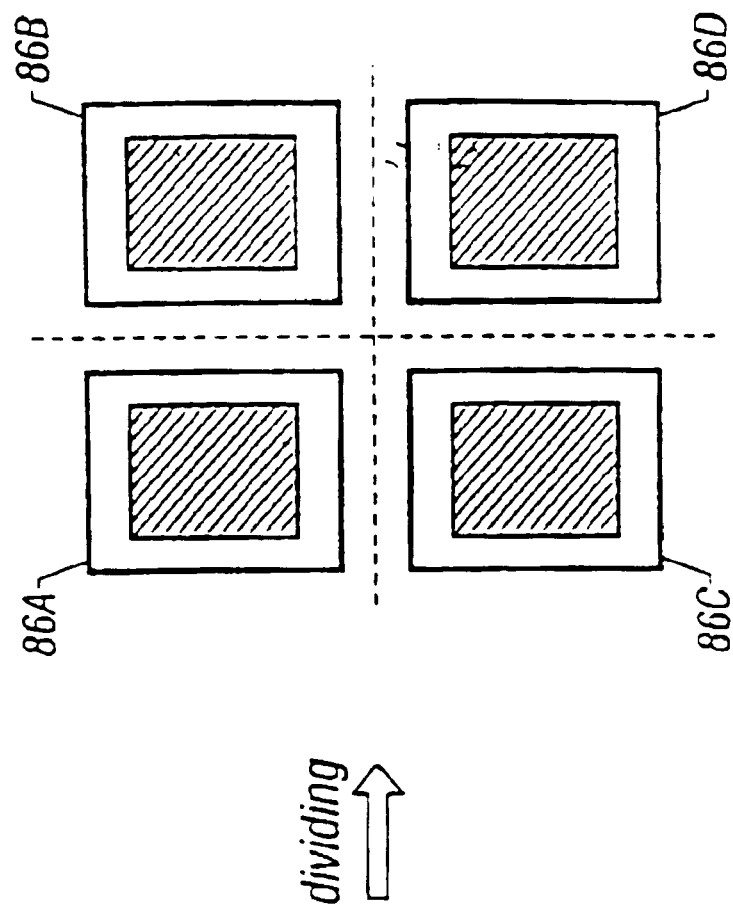
FIG. 9 is an explanatory view of division of a substrate.
Figure 9:
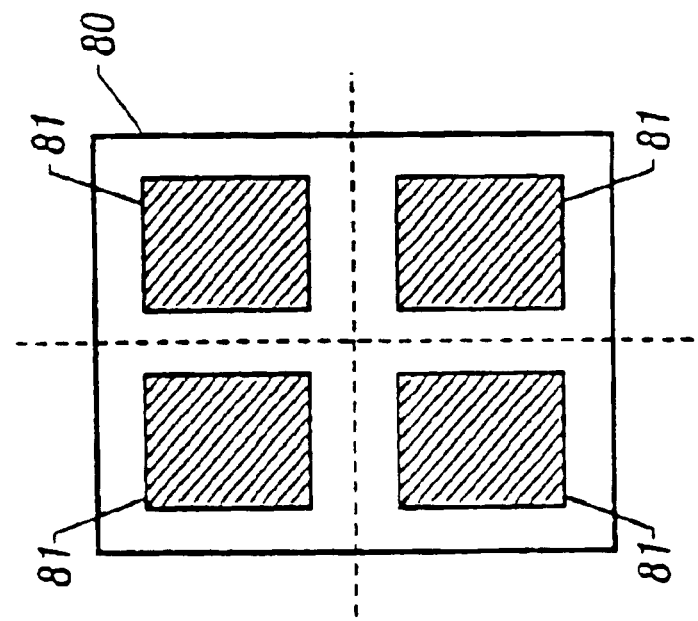

Also, as shown in FIG. 9, it is presumed that after semiconductor devices are formed, the substrate 80 is divided into pieces having a length shorter than the length of the linear laser beam. Thus, in order to achieve the state that the region 4 or 8 shown in FIG. 13(B) or 14(B), which is irradiated with the overlapped end portions of the laser beams in the longitudinal direction thereof, are positioned outside the device formation region 81, length L of the linear laser bean, 82 in the longitudinal direction is made longer than width W of the device-formation region 81.

Figure 8E:
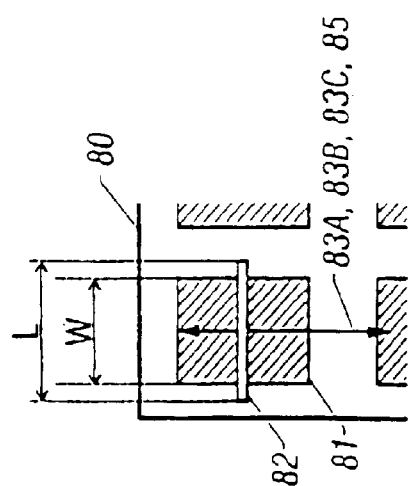
FIGS. 8(A) to 8(E) are explanatory views of scanning paths of a laser beam.
Figure 8B:
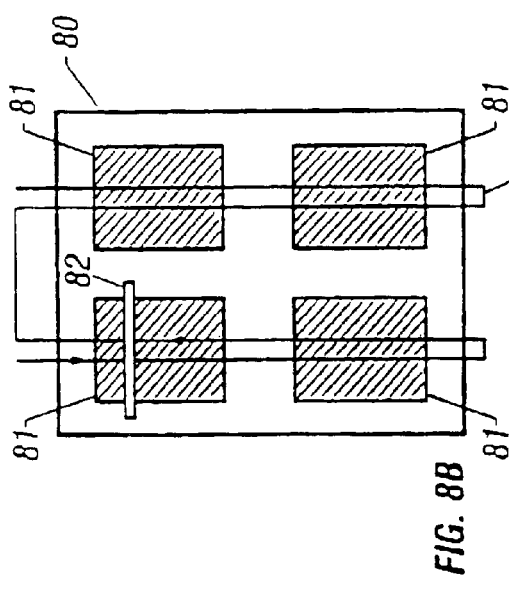
Figure 8D:
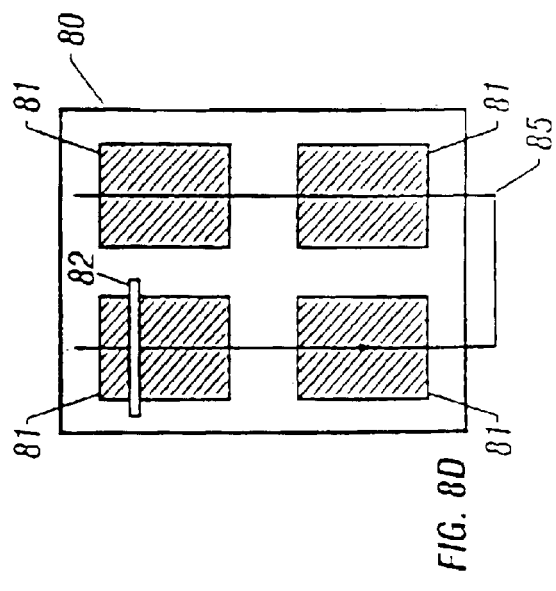
Figure 8A:
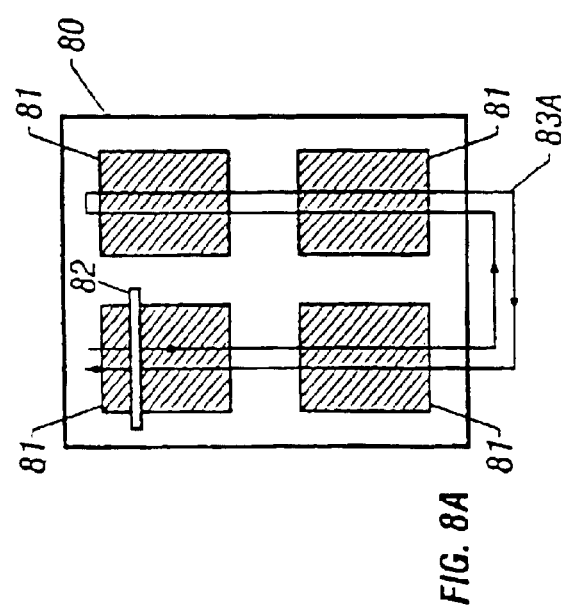
Figure 8C:
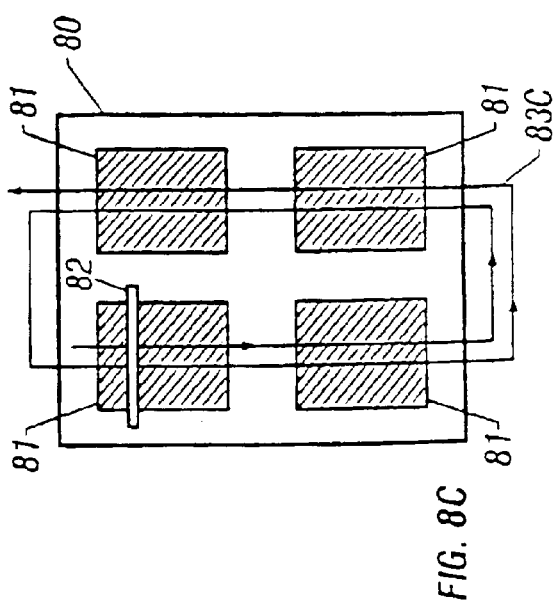

In order to achieve the two-stage irradiation, as shown in FIGS. 8(A) to 8(C), scanning paths 83a to 83c are set to be parallel and to draw one continuous line so that the device-formation regions 81 are twice irradiated with the linear laser beam 82. When one-stage irradiation is performed, as shown in FIG. 8(D), for example, the scanning path 85 may be set. The scanning paths 83a to 83c and 85 are made in uniform direction for all device-formation regions 80 on the same substrate 80.

In order to make scanning of the linear laser beam along the scanning paths as shown in FIGS. 8(A) to 8(C) or 8(D), the irradiation of the linear laser beam 82 may be performed while the linear laser beam is moved along the direction substantially orthogonal to the longitudinal direction or the beam and relatively to the surface 80 to be irradiated. Actually, the laser beam 82 is not moved but the stage 37 is rotated and moved horizontally in the laser irradiation apparatus shown in FIGS. 1 to 3, so that the substrate having the surface 80 to be irradiated is moved and the scanning of the linear laser beam 82 along the scanning path 83a, 83b, or 82c is performed.

In this embodiment, since the width W of the device-formation region 81 is shorter than length L of the linear laser beam 82, the device-formation region 81 is not scanned with the end portion of the linear laser beam 82. Accordingly, the film quality of the thus obtained crystalline silicon film 76 can be made uniform, so that the characteristics of semiconductor devices formed in the device-formation regions 81 can be made uniform. Further, since many substrates on which semiconductor devices having the same characteristics are formed, can be produced by one step by processing the substrate 80 with a large area, the throughput can be improved.

[Third Embodiment]

In this embodiment, using the crystalline silicon film 76 obtained in the second embodiment, steps of forming a thin-film transistor for driving picture elements of a liquid crystal display device will be described. FIGS. 10(A) to 10(D) and 11(A) to 11(C) show manufacturing steps of the thin-film transistor of this embodiment.

Figure 10A:
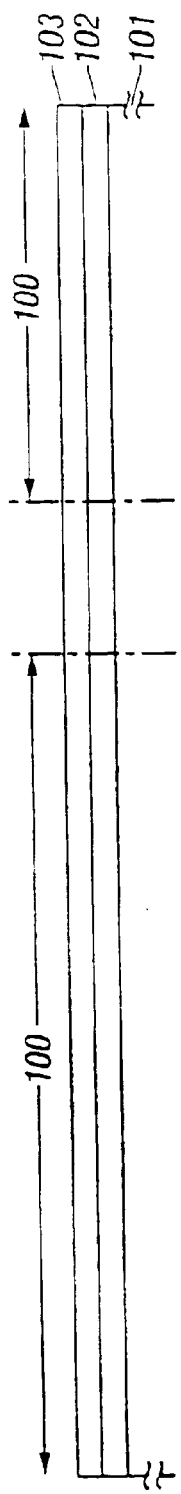
FIGS. 10(A) to 10(D) are explanatory views showing forming steps of a TFT in a third embodiment.

As shown in FIG. 10(A), a silicon oxide film with a thickness of 3000 Å as an under film 102 is deposited by a plasma CVD method or a low pressure thermal CVD method of a glass substrate 101, and a crystalline silicon film 103 made or a crystallized amorphous silicon film in accordance with the crystallization steps shown in the second embodiment, is formed on the surface of the under film 102.

Figure 10B:
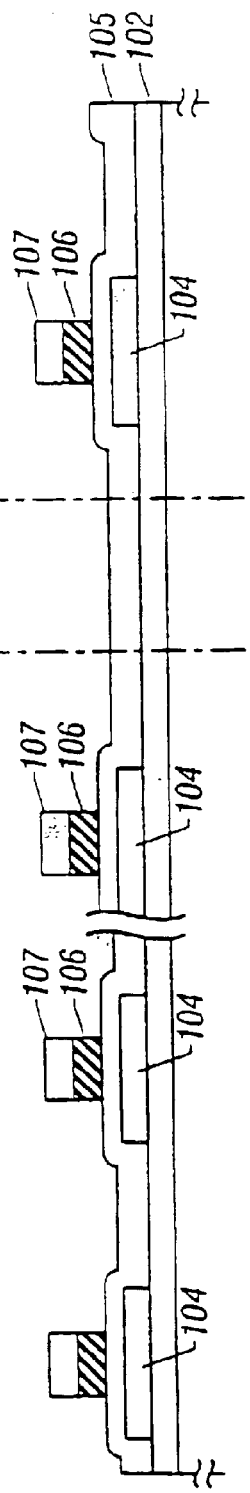

Next, as shown in FIG. 10(B), the crystalline silicon film 103 is etched into island-like portions, so that a plurality of active layers 104 are formed at predetermined positions in a device-formation region 100. In this embodiment, as shown in FIGS. 8(A) to 8(D) and 9, since an object is to provide four device-substrates with the same characteristics by dividing the glass substrate 101 into four pieces, the rectangular device-formation regions 100 on which thin film transistors are formed, are arranged on the glass substrate 101 in the matrix of 2×2. A plurality of active layers 104 are formed at predetermined positions in the device-formation region 100. Thus, when the crystalline silicon film 103 is obtained, the end portion of the linear laser beam is made not to pass through the inside of the device-formation region 100.

Next, a silicon oxide film 105 constituting a gate insulating film and having a thickness of 1000 to 1500 Å is formed by the plasma CVD method, and an aluminum film constituting a gate electrode 106 and having a thickness of 5000 Å is deposited by a sputtering method. If scandium of 0.2 weight % is mixed in the aluminum in advance, it is possible to prevent generation of hillock or whiskers in the subsequent heating steps.

Next, the surface of the aluminum film is subjected to anodic oxidation, so that fine anodic oxidation material not shown is formed into a very thin film. Next, a mask 107 of a resist is formed on the surface of the aluminum film. At this time, since the fine anodic oxidation material rot shown is formed on the surface of the aluminum film, it is possible to form the mask 107 of the resist brought into close contact. Then, using the mask 107 of the resist, the aluminum film is etched to form the gate electrode 106.

Figure 10C:
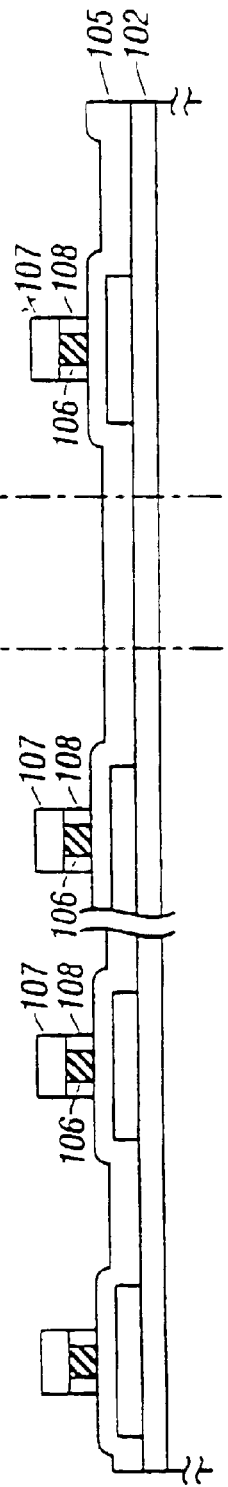

As shown in FIG. 10(C), while the mask 107 of the resist remains, the gate electrode 106 is subjected to anodic oxidation to form porous anodic oxidation material 108 with a thickness of 4000 Å. At this time, since the mask 107 of the resist is brought into close contact with the surface of the gate electrode 106, the porous anodic oxidation material 108 is formed only on the side of the gate electrode 106.

Figure 10D:
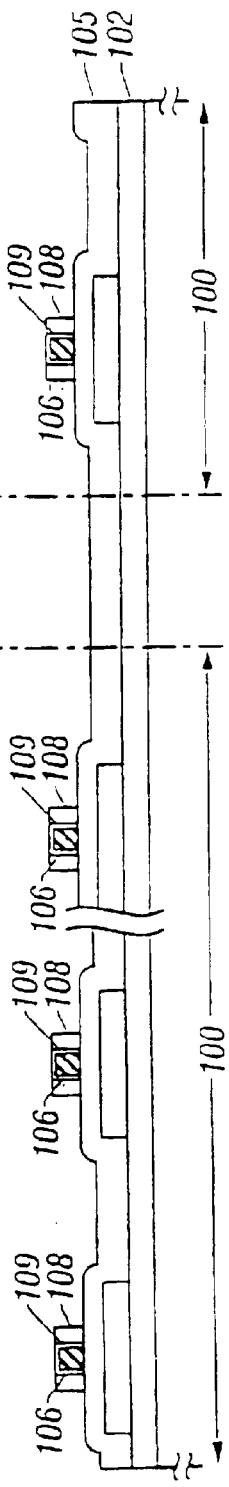

Next, as shown in FIG. 10(D), after the mask 107 of the resist is peeled off, the gate electrode 106 is again subjected to the anodic oxidation in an electrolytic solution to form fine anodic oxidation material 109 with a thickness of 1000 Å.

The anodic oxidation materials can be changed by changing the solution used. In the case where the porous anodic oxidation material 108 is formed, an acid solution including citric acid, oxalic acid, chromic acid, or sulfuric acid of 3 to 20% may be used. On the other hand, in the case where the fine positive anodic oxidation material 109 is formed, an electrolytic solution made of an ethylene glycol solution which includes tartaric acid, boric acid, or nitric acid of 3 to 10% and PH of which is adjusted to about 7, may be used.

As shown in FIG. 11(A), with the mask of the gate electrode 106, the porous anodic oxidation material 108 around the gate electrode, and the fine anodic oxidation material 109, the silicon oxide film 105 is etched to form the gate insulating film 110.

As shown in FIG. 11(B), after the porous anodic oxidation material 108 is removed, bay an ion doping method, impurities are injected into the active layer 104 with the mask of the gate electrode 106, the fine anodic oxidation material 109, and the gate insulating film 110. In this embodiment, in order to form a P-channel TFT, phosphine ($PH_3$) is used as a doping gas, so that phosphorus ions are doped. At the doping, conditions such as a dose amount and acceleration voltage are controlled so that the gate insulating film 110 functions as a semi-transparent mask.

As a result of doping, the phosphorus ions in high concentration are injected into regions not covered with the gate insulating film 110, so that a source region 111 and a drain region 112 are formed. The phosphorus ions in low concentration is injected into regions covered with only the gate insulating film 110, so that regions 113 and 114 with low concentration impurity are formed. Since impurities are not injected into regions immediately under the gate electrode 106, a channel region 115 is formed.

Since the region 113 and 114 with low concentration impurity function as high resistance regions, they contributes to reduction of an off-current. Especially, the low concentration impurity region 113 at the side of the drain region 112 is referred to as LDD. Further, by sufficiently increasing the thickness of the fine anodic oxidation material 109, the region immediately under the fine anodic oxidation material 109 is made into an offset region, so that the off-current can be reduced further.

After the doping step, in the laser irradiation apparatus shown in FIGS. 1 to 3, the laser annealing is performed, so that the doped phosphorus ions are activated. The annealing conditions in this case are such that the energy density of the laser is within the range of 100 mJ/cm$^2$ to 350 mJ/cm$^2$, for example, 160 mJ/cm$^2$, the irradiation of 20 to 40 shots of the linear laser beams is performed when attention is paid to an arbitrary point on the surface to be irradiated, and the substrate temperature is kept at 200° C. Since one-stage irradiation is performed, the scanning of the linear laser beam may be performed along the scanning path 85 shown in FIG. 8(D) At this time, the end portion of the linear laser beam is made not to pass through the device-formation region 100.

After the laser annealing, the thermal annealing may be performed. In this case, heating at a temperature of 450° C. and for two hours may be performed.

As shown in FIG. 11(C), by t he plasma CVD method, a silicon oxide film with a thickness of 5000 Å as an interlayer insulator 116, is formed. As the interlayer insulator 116, a single layer film of silicon nitride film, or a laminated film of silicon oxide film and silicon nitride film may be formed instead of the single layer film of silicon oxide film. Next, by a well-known etching method, the interlayer insulator 116 made of the silicon oxide film is etched, so that contact holes are respectively formed in the source region 111 and the drain region 112.

Next, an aluminum film with a thickness of 4000 Å is formed by a sputtering method, which is patterned to form electrodes 117 and 118 connected to the source region 111 and the drain region 112. A silicon nitride film as a passivation film 119 is formed, and a contact hole for electrode 118 at the side of the drain region 112 is formed in the passivation film 119. Next, an ITO film is formed and patterned so that a picture element electrode 120 is formed in the contact hole connected to the electrode.

After the above-described steps, the TFT having the LDD structure is formed in the device-formation region 100 on the glass substrate 101 Lastly, the substrate 101 is divided for each device-formation region 100 as shown in FIG. 9, so that four pieces of panels for the liquid crystal display device can be obtained.

In this embodiment, manufacturing steps of N-channel thin-film transistor for driving picture elements of the liquid crystal display device have been explained. However, a thin-film transistor constituting a peripheral driving circuit and a thin-film transistor for driving picture elements may be formed in one device-formation region 100 at the same time. In this case, the conductivity of the thin-film transistor may be controlled by using a well-known CMOS technique so that the thin-film transistor constituting the peripheral driving circuit becomes a complementary thin-film transistor composed of a N-channel thin film transistor and a P-channel thin-film transistor.

[Fourth Embodiment]

This embodiment relates to a scanning path of a laser beam in the case where a substrate is not divided. In this case, there is the possibility that the region 4 in which end portions of a linear laser beam are overlapped with each other as shown in FIG. 13(B), or the region 8 where the end portions are brought into contact with each other as shown in FIG. 14(B), is arranged in the device-formation region. In this case, semiconductor devices are arranged so that the semiconductor devices do not extend over (is not positioned at, is not positioned near) the region 4 or 8 shown in FIG. 13(B) or 14(B)

For example, in FIGS. 10(A) to 10(D), in order not to make the active layer 104 of the thin-film transistor and the region 4 or 8 overlap with each other, the length of the linear beam may be adjusted so that the end portion of the laser beam passes through a region 200 where the active layer 104 is not formed.

Figure 14:
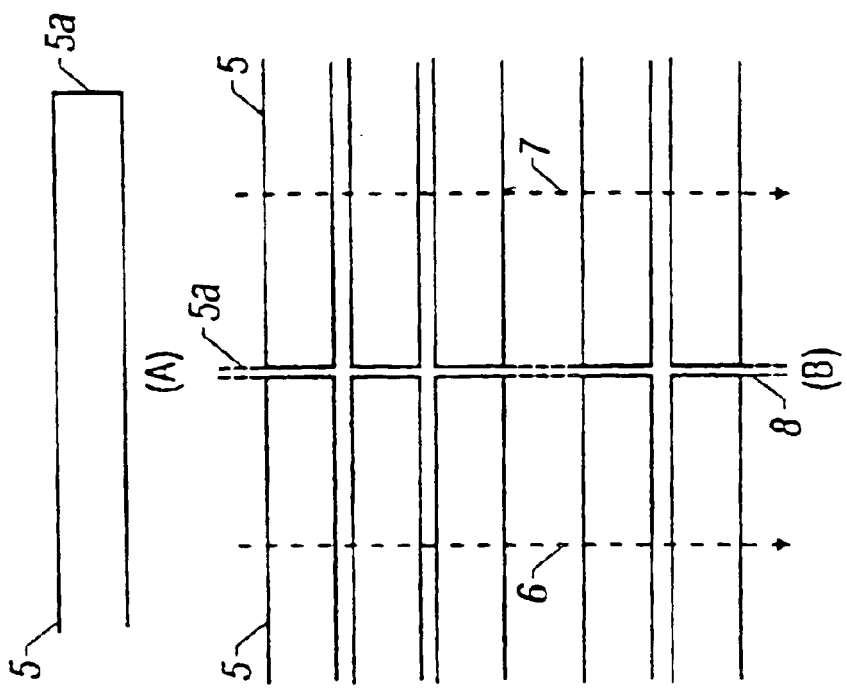
FIGS. 14(A) and 14(B) are explanatory views showing the shape of a conventional laser beam and a scanning method.
Figure 13:
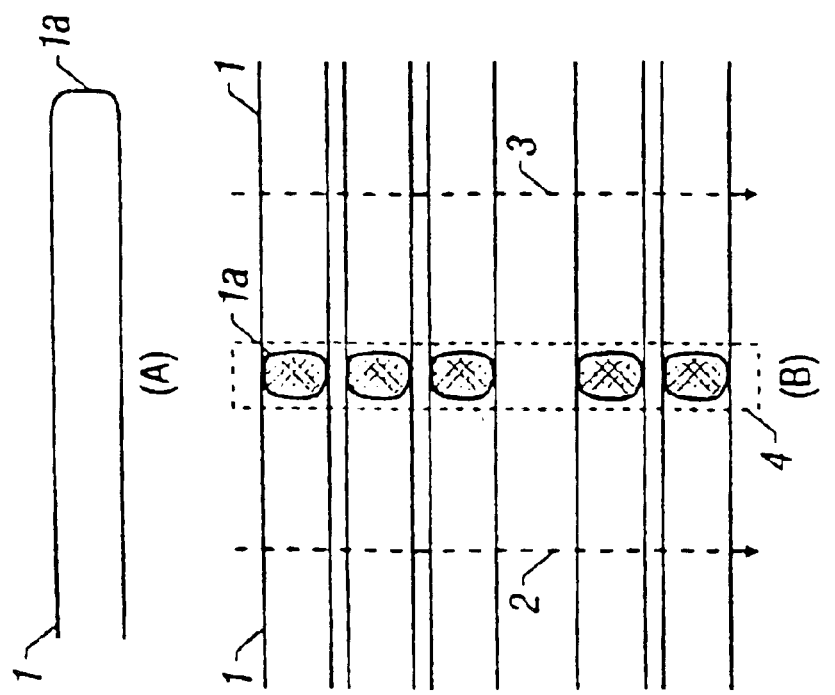
FIGS. 13(A) and 13(B) are explanatory views showing the shape of a conventional laser beam and a scanning method.

Depending on the density of the semiconductor devices on the substrate, it is determined whether the portion (joint portion) irradiated with the overlapped ends of the linear laser beams is made a portion like the region 4 in FIG. 13 where the end portions of the laser beams are overlapped to some extent, or a portion like the region 8 in FIG. 14 where the end portions are brought into contact with each other.

If the interval between semiconductor devices is the order of millimeter, the shape of the end portion of the linear laser beam, that is, the distribution of energy density at the end portion does not become a problem. Accordingly, as shown in FIG. 13(A), it is possible to perform the irradiation of the linear laser beam without shaping the end portion 1a of the linear laser beam 1. However, if the interval between semiconductor devices is less than the order of millimeter, it is necessary to shape the linear laser beam by a slit to make the rectangle end portion as shown in FIG. 14(A), and further to make scanning so that the end portions of the linear laser beam is brought into contact with each other as shown in FIG. 14(B).

Further, if the interval between the semiconductor devices becomes the order of micron, even if the scanning of the linear laser beam is performed as shown in FIG. 14(B), doe to the limit of accuracy in alignment or the like in the process, there is a fear that a device is formed in the region 8 where the end portion 5a of the laser beam 5 passes. That is, it is difficult to form a device in a region where the end portion. 5a of the laser beam 5 does not pass.

In the case where as a semiconductor device, for example, a panel of a liquid crystal display is formed, the interval at which thin-film transistors as semiconductor devices formed on the substrate is about 10 $\mu$m to 100 $\mu$m. Thus, is this case, using the slit, the end portion of the linear laser beam in the longitudinal direction thereof is cut, and the scanning of the linear laser beam is performed so that the joint portions of the linear laser beam, that is, the end portions of the beam are brought into contact with each other. In this case, if the joint portions are brought into close contact with each other by the accuracy of about 10 to 20 $\mu$m, the accuracy is sufficient It is possible to form a panel for a liquid crystal display without forming semiconductor devices on the joint portion.

[Fifth Embodiment]

As shown in FIGS. 8(A) to 8(D), in the second embodiment, the device-formation regions 80 are arranged on the substrate 80 in the matrix of 2×2. In order to make the device-formation regions irradiated uniformly with the laser beam, it is preferable to arrange the device-formation regions symmetrically with respect to the substrate. Thus, the regions are preferably arranged in the matrix of 2n×2n (n is natural numbers more than one). In this embodiment, as shown in FIGS. 12(A) and 12(B), by using a substrate with a larger area, the device-formation regions 91 of 4×4 are arranged on the substrate, so that by one step, sixteen pieces of substrates on which semiconductor devices having the same characteristics can be obtained from the one substrate 90.

Figures 12A, 12B, 12C:
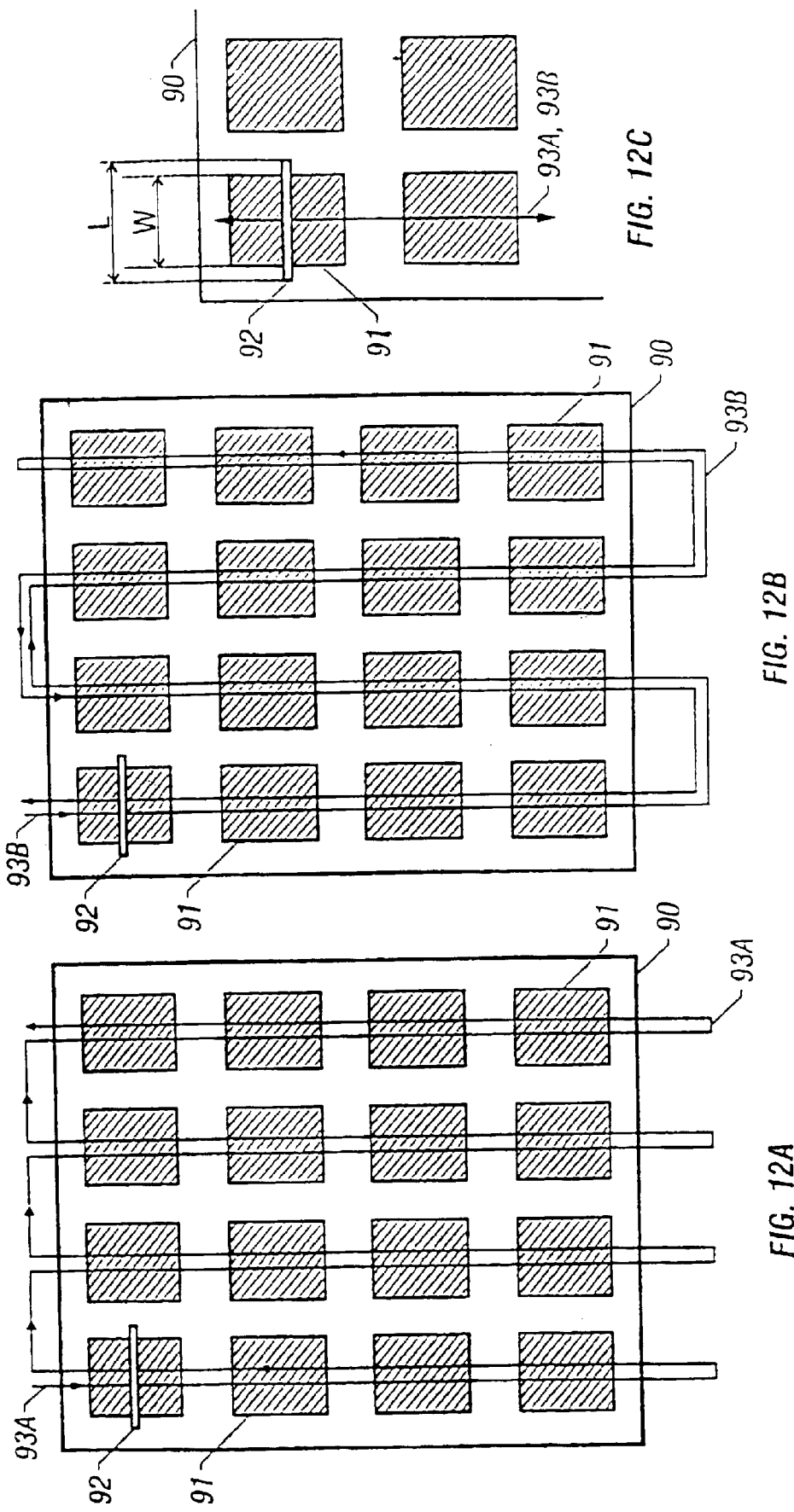
FIGS. 12(A) to 12(C) are explanatory views of scanning paths of a laser beam in a fifth embodiment.

In order to perform the two-stage irradiation of the linear laser beam 92, for example as shown in FIGS. 12(A) and 12(B), the scanning paths 93A and 93B may be set. Further, in order to perform uniform scanning of the linear laser beam 93, the length L of the linear laser beam 92 in the longitudinal direction thereof is made longer than the width W of the device-formation region 91, and the region irradiated with the overlapped end portions of the laser beam 92 in the longitudinal direction thereof is made the outside of the device-formation region 91.

As described above, according to the present invention, it is possible to perform the step of laser annealing for a semiconductor material having a large area with a high throughput. Further, according to the present invention, it is possible to suppress variation in characteristics among a plurality of semiconductor devices formed by the laser annealing process for a semiconductor film with a large area.

The present invention is specifically effective in the case where many TFTs are formed on the glass substrate with a large area over the width of the linear laser beam. Especially, when the substrate is for constructing a liquid crystal display, it is expected that a large picture surface is required, and the present invention can make such a large surface. Thus, the present invention is useful in technology.

What is claimed is:

1. A method for manufacturing a display device comprising:

forming a semiconductor film over a substrate;

irradiating a first region of the semiconductor film with a laser light along a first scanning direction;

irradiating the first region of the semiconductor film with the laser light along a second scanning direction which is opposite to the first scanning direction;

irradiating a second region of the semiconductor film with the laser light along a third scanning direction, wherein the second region is partially overlapped with the first region;

irradiating the second region of the semiconductor film with the laser light along a fourth scanning direction which is opposite to the third scanning direction;

etching the semiconductor film into a plurality of semiconductor layers; and forming a plurality of device formation regions in each of the first region and the second region so as to exclude the overlapped region of the first region and the second region by using at least one of the plurality of semiconductor layers.

2. A method for manufacturing a display device according to claim 1, wherein the laser light comprises an excimer laser light.

3. A method for manufacturing a display device according to claim 1, wherein the laser light has a linear cross section of 10 cm or more on an irradiation surface.

4. A method for manufacturing a display device according to claim 1, wherein a plurality of thin film transistors for driving a plurality of picture elements and for constituting a driver circuits are formed in the plurality of device formation regions.

5. A method for manufacturing a display device according to claim 1, wherein the display device is a liquid crystal display device.

6. A method for manufacturing a display device comprising:

forming a semiconductor film over a substrate;

irradiating a first region of the semiconductor film with a laser light along a first scanning direction;

irradiating the first region of the semiconductor film with the laser light along a second scanning direction which is opposite to the first scanning direction;

irradiating a second region of the semiconductor film with the laser light along a third scanning direction;

irradiating the second region of the semiconductor film with the laser light along a fourth scanning direction which is opposite to the third scanning direction;

etching the semiconductor film into a plurality of semiconductor layers;

forming a plurality of device formation regions in each of the first region and the second region by using at least one of the plurality of semiconductor layers; and dividing the substrate into a plurality of device substrates, wherein each of the plurality of device substrates comprises at least one of the plurality of the device formation regions.

7. A method for manufacturing a display device according to claim 6, wherein the laser light comprises an excimer laser light.

8. A method for manufacturing a display device according to claim 6, wherein the laser light has a linear cross section of 10 cm or more on an irradiation surface.

9. A method for manufacturing a display device according to claim 6, wherein a plurality of thin film transistors for driving a plurality of picture elements and for constituting a driver circuits are formed in the plurality of device formation regions.

10. A method for manufacturing a display device according to claim 6, wherein the display device is a liquid crystal display device.

11. A method for manufacturing a display device comprising:

forming a semiconductor film over a substrate;

irradiating a first region of the semiconductor film with a laser light along a first scanning direction by moving the substrate;

irradiating the first region of the semiconductor film with the laser light along a second scanning direction which is opposite to the first scanning direction by moving the substrate;

irradiating a second region of the semiconductor film with the laser light along a third scanning direction by moving the substrate, wherein the second region is partially overlapped with the first region;

irradiating the second region of the semiconductor film with the laser light along a fourth scanning direction which is opposite to the third scanning direction by moving the substrate;

etching the semiconductor film into a plurality of semiconductor layers;

forming a plurality of device formation regions in each of the first region and the second region by using at least one of the plurality of semiconductor layers; and dividing the substrate into a plurality of device substrates, wherein each of the plurality of device substrates comprises at least one of the plurality of the device formation regions.

12. A method for manufacturing a display device according to claim 11, wherein the laser light comprises an excimer laser light.

13. A method for manufacturing a display device according to claim 11, wherein the laser light has a linear cross section of 10 cm or more on an irradiation surface.

14. A method for manufacturing a display device according to claim 11, wherein a plurality of thin film transistors for driving a plurality of picture elements and for constituting a driver circuits are formed in the plurality of device formation regions.

15. A method for manufacturing a display device according to claim 11, wherein the display device is a liquid crystal display device.

16. A method for manufacturing a display device comprising:

forming a semiconductor film over a substrate;

irradiating a first region of the semiconductor film with a laser light along a first scanning direction;

irradiating the first region of the semiconductor film with the laser light along a second scanning direction which is opposite to the first scanning direction;

irradiating a second region of the semiconductor film with the laser light along a third scanning direction, wherein the second region is partially overlapped with the first region;

irradiating the second region of the semiconductor film with the laser light along a fourth scanning direction which is opposite to the third scanning direction;

etching the semiconductor film into a plurality of semiconductor layers;

forming a plurality of device formation regions in each of the first region and the second region by using at least one of the plurality of semiconductor layers; and dividing the substrate into a plurality of device substrates, wherein each of the plurality of device substrates comprises at least one of the plurality of the device formation regions.

17. A method for manufacturing a display device according to claim 16, wherein the laser light comprises an excimer laser light.

18. A method for manufacturing a display device according to claim 16, wherein the laser light has a linear cross section of 10 cm or more on an irradiation surface.

19. A method for manufacturing a display device according to claim 16, wherein a plurality of thin film transistors for driving a plurality of picture elements and for constituting a driver circuits are formed in the plurality of device formation regions.

20. A method for manufacturing a display device according to claim 16, wherein the display device is a liquid crystal display device.

21. A method for manufacturing a display device comprising:

forming a semiconductor film over a substrate;

irradiating a first region of the semiconductor film with a laser light along a first scanning direction by moving the substrate;

irradiating the first region of the semiconductor film with the laser light along a second scanning direction which is opposite to the first scanning direction by moving the substrate;

irradiating a second region of the semiconductor film with the laser light along a third scanning direction by moving the substrate, wherein the second region is partially overlapped with the first region;

irradiating the second region of the semiconductor film with the laser light along a fourth scanning direction which is opposite to the third scanning direction by moving the substrate;

etching the semiconductor film into a plurality of semiconductor layers; and forming a plurality of device formation regions in each of the first region and the second region so as to exclude the overlapped region of the first region and the second region by using at least one of the plurality of semiconductor layers.

22. A method for manufacturing a display device according to claim 21, wherein the laser light comprises an excimer laser light.

23. A method for manufacturing a display device according to claim 21, wherein the laser light has a linear cross section of 10 cm or more on an irradiation surface.

24. A method for manufacturing a display device according to claim 21, wherein a plurality of thin film transistors for driving a plurality of picture elements and for constituting a driver circuits are formed in the plurality of device formation regions.

25. A method for manufacturing a display device according to claim 21, wherein the display device is a liquid crystal display device.

26. A method for manufacturing a display device comprising:

forming a semiconductor film over a substrate;

irradiating a first region of the semiconductor film with a laser light along a first scanning direction by moving the substrate;

irradiating the first region of the semiconductor film with the laser light along a second scanning direction which is opposite to the first scanning direction by moving the substrate;

irradiating a second region of the semiconductor film with the laser light along a third scanning direction by moving the substrate;

irradiating the second region of the semiconductor film with the laser light along a fourth scanning direction which is opposite to the third scanning direction by moving the substrate;

etching the semiconductor film into a plurality of semiconductor layers;

forming a plurality of device formation regions in each of the first region and the second region by using at least one of the plurality of semiconductor layers; and dividing the substrate into a plurality of device substrates, wherein each of the plurality of device substrates comprises at least one of the plurality of the device formation regions.

27. A method for manufacturing a display device according to claim 26, wherein the laser light comprises an excimer laser light.

28. A method for manufacturing a display device according to claim 26, wherein the laser light has a linear cross section of 10 cm or more on an irradiation surface.

29. A method for manufacturing a display device according to claim 26, wherein a plurality of thin film transistors for driving a plurality of picture elements and for constituting a driver circuits are formed in the plurality of device formation regions.

30. A method for manufacturing a display device according to claim 26, wherein the display device is a liquid crystal display device.

* * * * *